United States Patent [19]

Emshwiller

[11] 4,039,968

[45] Aug. 2, 1977

[54] SYNCHRONIZING CIRCUIT

[75] Inventor: MacLellan Emshwiller, Andover, Mass.

[73] Assignee: Bell Telephone Laboratories, Incorporated, Murray Hill, N.J.

[21] Appl. No.: 685,340

[22] Filed: May 11, 1976

[51] Int. Cl.² ............................................. H03B 3/08
[52] U.S. Cl. ......................................... 331/19; 331/76; 331/61; 331/111
[58] Field of Search .................... 325/421; 331/19, 76, 331/77, 25, 36 C; 328/223

[56] References Cited

U.S. PATENT DOCUMENTS

| | | | |
|---|---|---|---|
| 3,021,492 | 2/1962 | Kaufman | 331/36 C |
| 3,155,919 | 11/1964 | Baxter et al. | 331/19 |
| 3,379,995 | 4/1968 | Koontz et al. | 331/19 |
| 3,405,369 | 10/1968 | Couvillon | 331/36 C |
| 3,593,167 | 7/1971 | Koulopoulos | 331/36 |
| 3,657,664 | 4/1972 | Brack | 331/1 |
| 3,714,595 | 1/1973 | Denenberg et al. | 329/122 |
| 3,864,634 | 2/1975 | Dragonetti | 325/419 |

Primary Examiner—John Kominski
Attorney, Agent, or Firm—Bryan W. Sheffield

[57] ABSTRACT

A circuit for synchronizing a microwave oscillator with a reference source of known frequency. The synchronizing circuit includes a phase-lock loop which compares the output of a free-running, crystal-controlled, voltage-controlled oscillator with the output of a burst oscillator. The output of the burst oscillator has a comb spectrum comprising harmonics of the reference frequency and the phase-lock loop locks onto a selected one of the comb harmonics.

2 Claims, 2 Drawing Figures

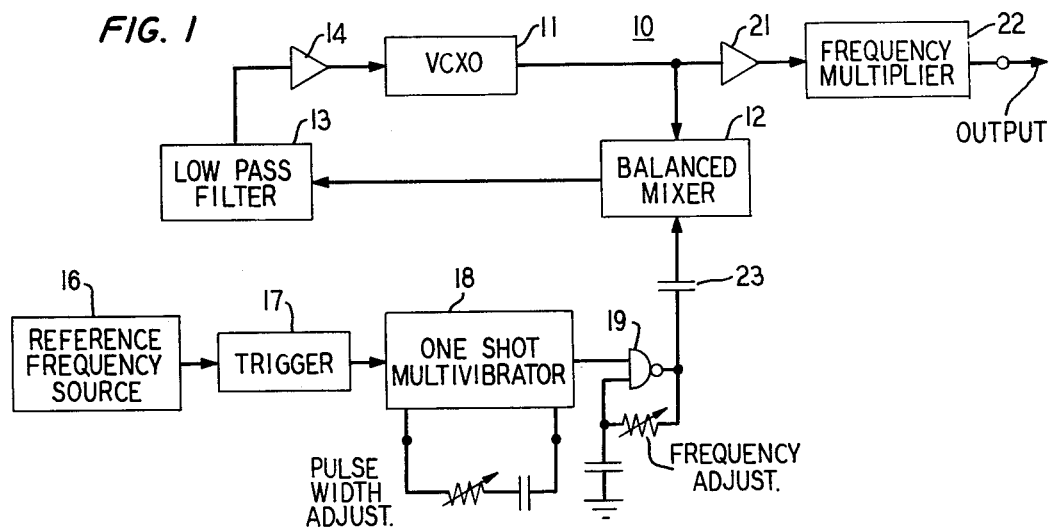
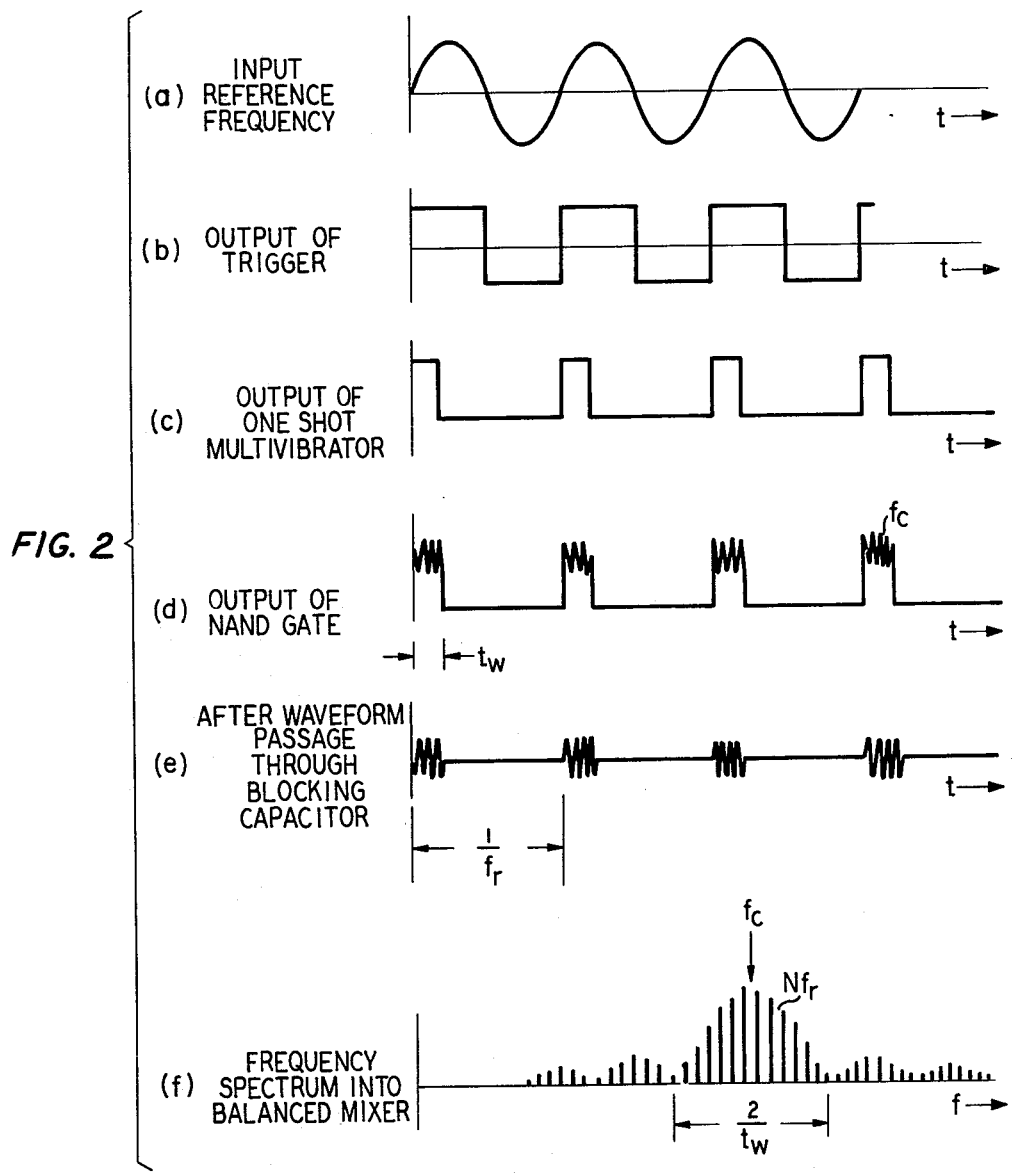

SYNCHRONIZING CIRCUIT

BACKGROUND OF THE INVENTION a. Field of the Invention

Broadly speaking, this invention relates to oscillators. More particularly, in a preferred embodiment, this invention relates to methods and apparatus for synchronizing an oscillator with a reference source of known frequency.

b. Discussion of the Prior Art

As is well known, a substantial portion of all long distance telecommunication is satisfied by microwave radio systems operating in the 4 and 6 GHz common carrier bands. Such systems typically employ frequency modulation and no excessive demands are placed on the frequency stability of the oscillators employed, other than they must, of course, satisfy the requirements of the Federal Communications Commission.

Recently, a proposal has been made that such existing FM systems be converted to single-sideband operation which will effectively double system capacity with virtually no increase in plant. However, single-sideband operation demands far greater frequency stability for the microwave oscillators employed than does frequency modulation. Of course, it would be possible to employ a stable reference frequency source, operating at a lower frequency, and then multiply this source up in frequency to the desired output frequency in the 4 GHz or 6 GHz common carrier band. However, this unsophisticated approach would be very expensive and, in view of the large number of different channel assignments commonly employed in such microwave systems, would require a series of individually designed circuits for each microwave system.

SUMMARY OF THE INVENTION

The problem, then, is to devise a circuit which enables one to synchronize a microwave oscillator with a reference frequency source, but which does not require complicated and expensive circuitry or a circuit design which must be customized to the particular channel or system to be controlled. Fortunately, this problem has been solved by the instant invention which, in a preferred embodiment comprises, a voltage-controlled oscillator having a free-running output frequency which is close to the desired output frequency. The circuit further includes means, connected to the source of the reference signal, for generating a repetitive pulse train phase-synchronized with the reference signal and which has a comb-like frequency spectrum comprising harmonics of the reference signal. The circuit also includes means, operatively associated with the generating means, for adjusting the comb-like frequency spectrum such that the particular reference signal harmonic contained therein which has the same frequency as the desired ouput frequency has a non-zero amplitude, and means connected to said voltage-controlled oscillator and to said generating means, for forcing said free-running frequency to coincide with said particular reference frequency harmonic.

The invention and its mode of operation will be more fully understood from the following detailed description, when taken with the appended drawings, in which:

DESCRIPTION OF THE DRAWING

FIG. 1 is a block schematic drawing of an illustrative synchronizing circuit according to the invention; and FIG. 2 depicts the waveforms which are found at various locations within the circuitry shown in FIG. 1.

DETAILED DESCRIPTION OF THE INVENTION

FIG. 1 is a block schematic diagram of an illustrative synchronizing circuit 10, according to the invention. As shown, synchronizing circuit 10 includes a conventional, phase-lock loop circuit comprising a voltage-controlled, crystal oscillator 11, a balanced mixer 12 used as a phase detector, and a low-pass filter 13. An amplifier 14 is used, as needed, to boost the level of the signals applied to the control input of the voltage-controlled crystal oscillator (VCXO).

A reference signal from an external frequency source 16 is connected to the input of a trigger circuit 17. The output of trigger circuit 17 is connected, in turn, to the input of a one-shot multivibrator 18, the output of which is connected to one of the two inputs of a NAND-gate 19. The output of NAND-gate 19 is connected to the balanced mixer 12. The output of the synchronizing circuit shown in FIG. 1 is actually the output of VCXO 11. Typically, however, this output signal will be amplified by an amplifier 21 and then multiplied up to the desired output frequency in a multiplier 22.

Referring now to FIG. 2, which depicts the waveforms which are found at various locations within the synchronizing circuit shown in FIG. 1, graph (*a*) represents the output of reference frequency source 16. As will be noted, this waveform is a pure sinusoid and is typically derived from a highly stable and accurate frequency source, such as a double-oven, crystal-controlled oscillator.

As will subsequently be explained, the frequency of reference source 16 and the output frequency of VCXO 11 are functions of the desired output frequency of multiplier 22. For example, if it is desired that the output signal of multiplier 22 has a frequency lying within the 6 GHz, common carrier band, the output of VCXO 11 will advantageously fall between 122 and 132 MHz. This, in turn, establishes the frequency of reference source 16 and 309 kHz. Comparable values for an output signal falling within the 4 GHz, common carrier band are 118 to 128 MHz and 625 kHz, respectively.

Trigger circuit 17 may comprise either a Schmitt trigger or a comparator and, as shown in graph (*b*) of FIG. 2, yields a square wave output signal which is synchronized with the output of reference source 16. Basically, the function of trigger circuit 17 is to yield a TTL-compatible output to drive the one-shot multivibrator 18. Depending on the particular application, the trigger circuit which produces the least amount of phase jitter is, of course, preferred. Graph (*c*) depicts the output wave from one-shot multivibrator 18. As can be seen, the leading edge of each pulse in this waveform bears a fixed relationship to the phase of the reference signal. The width of the pulse from multivibrator 18 may be varied by the simple RC network shown; the optimum choice is discussed below. The output pulses from multivibrator 18 are, in turn, applied to one of the two inputs of NAND-gate 19, which is preferably a Schottky TTL NAND-gate. The other input to the NAND-gate is derived from the output of the NAND-gate through the frequency-adjusting RC network shown.

When the output pulse from multivibrator 18 goes high, NAND-gate 19 is placed in an indeterminate or "race" condition and, thus, oscillates at a high frequency. This frequency can be controlled, over a certain range, by suitable choice of the RC network in the feedback path. Graph (d) shows the output waveform from NAND-gate 19. As will be noted, this waveform comprises a series of pulses of duration $t_w$, which corresponds substantially to the duration of the output pulses from multivibrator 18. Each output pulse from NAND-gate 19 comprises several cycles of the frequency $f_c$, where $f_c$ is determined by the feedback loop of NAND-gate 19. The output of NAND-gate 19 is connected, via a capacitor 23, to the input of balanced mixer 12. The function of capacitor 23 is to block the pedestal of the waveform shown in graph (d), and the waveform after pedestal blocking by capacitor 23 is shown in graph (e) of FIG. 2. As will be noted, this waveform now comprises a repetitive train of bursts of $f_c$ spaced by a period corresponding to $1/f_r$, where $f_r$ is the frequency of the reference source. In other words, NAND-gate 19 acts as a burst oscillator having a starting phase which bears a fixed relationship to the input reference phase. Since the bursts for NAND-gate 19 are repetitive, the spectrum of the waveform shown in graph (e) is a comb spectrum, and is shown in graph (f). Since the phase of each burst is related to the reference frequency, the comb consists of harmonics of that reference frequency and is independent of its waveform.

Balanced mixer 12 will compare the output of VCXO 11 with the frequency comb from NAND-gate 19 and, if any one of the frequency components in the comb is close to the free-running frequency of VCXO 11, there will be generated a d.c. or low frequency difference signal which will pass through low-pass filter 13 and cause the VCXO to lock in phase, in accordance with the known behavior of a phase-lock loop. See, for example, *Phaselock Techniques* by F. M. Gardner, John Wiley & Sons, New York, 1966.

The free-running frequency of VCXO 11 will be controlled by its crystal and is nominally selected to be one of the harmonics of the reference frequency. The phase-lock loop will cause VCXO 11 to be pulled into exact lock with the desired reference frequency harmonic. Of course, the crystal associated with VCXO 11 should be selected such that it will determine the free-running frequency thereof with sufficient accuracy such that the VCXO cannot lock onto the wrong harmonic.

There are two adjustments which can be made to the burst generator comprising NAND-gate 19. Both of these adjustments affect the envelope of the frequency comb, shown in graph (f), but do not affect the precision of the harmonic frequency. The first adjustment pertains to the frequency of the NAND-gate oscillator and permits the main lobe of the comb envelope to be shifted to peak on the desired harmonic. This first adjustment is necessary because there is a fair possibility that the amplitude of the desired reference frequency harmonic may be zero in the frequency comb of graph (f). Accordingly, by shifting the frequency comb to the left or to the right, for example by adjusting the frequency of NAND-gate oscillator 19, we ensure that the desired reference frequency harmonic will have an amplitude which is sufficient to lock-in the phase-lock loop. The second adjustment pertains to the pulse width of the output pulses from the multivibrator which, in turn, controls the frequency spread of the main lobe of the comb envelope in an inverse manner. As will be apparent, a longer pulse will increase the amplitude of the comb envelope while at the same time decreasing the number of harmonics that are included therein. If the pulse is made too long, however, the envelope will become very narrow and then any drift in the center frequency $f_c$ may move the first null to the harmonic of interest. Accordingly, steps must be taken to ensure that the pulse is short enough so that the nulls of the comb envelope can never drift to the harmonic of interest.

With reference to the numerical examples previously given, for an output signal in the 6 GHz common carrier band, the harmonics of interest will range from the 401st to the 415th and the 418th to the 432nd harmonics of a 309 kHz reference frequency, while the corresponding figures for a 4 GHz signal are the 189th to the 206th harmonics of a 625 kHz reference frequency.

In practice, adjustments to the phase-lock loop are optimized by opening the loop at the point where the control voltage is connected to the control input of VCXO 11. Assuming that the VCXO is near to, but not exactly on, the desired harmonic of the reference frequency, the control signal will comprise a low frequency sine wave at the difference frequency. The amplitude of this difference frequency is first maximized by adjusting $f_c$. Then the pulse width can be lengthened to increase the amplitude but care must be taken not to increase the pulse width to a point where it makes the frequency envelope of the comb spectrum too narrow. In an experimental synchronizing circuit, actually built and tested, a pulse width of about 10 percent of the desired pulse spacing was employed. In a commercial synchronizing circuit the width of the pulse will be optimized to take into account the effects of temperature changes, component aging, etc.

Among the advantages presented by the above-described synchronizing circuit are its low cost and simplicity which is due, in part, to the small number of components employed, all of which are readily available. Another advantage of this circuit is its adaptability to all oscillators of a given type. Each different oscillator and particular channel, in either the 4 GHz or 6 GHz common carrier band, can be accommodated by simply adjusting $f_c$. Of course, this does not imply that the crystal employed in the VCXO, and other components of the microwave generator, might not have to be changed.

One skilled in the art can make various modifications and changes to the layout of parts shown without departing from the spirit and scope of this invention.

What is claimed is:

1. Apparatus for synchronizing an oscillator with a reference signal of known frequency, which comprises:
    a voltage-controlled oscillator having a free-running output frequency which is close to a desired output frequency;
    a trigger circuit, connected to said reference signal source, for generating a square wave signal in phase-synchronism with said reference signal;
    a one-shot multivibrator, connected to and triggered by said trigger circuit, for generating a train of pulses in phase-synchronism with said square wave signal, said pulse train having a predetermined duty cycle;
    a burst oscillator periodically enabled by the pulse train from said one-shot multivibrator, said burst oscillator having a predetermined output frequency and a comb-like frequency spectrum comprising discrete harmonics of said reference signal;

means, operatively associated with said generating means, for altering the envelope of said comb-like frequency spectrum such that the particular reference frequency harmonic contained therein which has the same frequency as the desired output frequency has a non-zero amplitude, said envelope altering means comprising:

means for adjusting the duty cycle of the pulse train from said one-shot multivibrator; and means for adjusting the output frequency of said burst oscillator, said apparatus further comprising:

means, connected to said voltage-controlled oscillator and to said burst oscillator for causing said free-running frequency to coincide with the frequency of said particular reference frequency harmonic.

2. The apparatus according to claim 1 wherein said burst oscillator comprises a NAND-gate having a first input connected to the output of said one-shot multivibrator and a second input, connected through a frequency-determining RC network, to the output of said NAND-gate.

* * * * *